(12) United States Patent
Wei et al.

(10) Patent No.: US 9,832,399 B2
(45) Date of Patent: Nov. 28, 2017

(54) IMAGE SENSOR AND METHOD FOR MANUFACTURING THE SAME

(71) Applicant: Taiwan Semiconductor Manufacturing Co., Ltd., Hsinchu (TW)

(72) Inventors: Chia-Yu Wei, Tainan (TW);
Chin-Hsun Hsiao, Kaohsiung (TW);
Po-Chun Chiu, Taipei (TW);
Yu-Hsuan Cheng, New Taipei (TW);
Yung-Lung Hsu, Tainan (TW);
Hsin-Chi Chen, Tainan (TW);
Ching-Ling Cheng, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/009,836

(22) Filed: Jan. 29, 2016

(65) Prior Publication Data
US 2017/0223285 A1    Aug. 3, 2017

(51) Int. Cl.
| | |
|---|---|
| H01L 31/062 | (2012.01) |
| H04N 5/359 | (2011.01) |
| H04N 5/374 | (2011.01) |
| H04N 5/232 | (2006.01) |
| H01L 27/146 | (2006.01) |

(52) U.S. Cl.
CPC ......... *H04N 5/359* (2013.01); *H01L 27/1463* (2013.01); *H01L 27/14623* (2013.01); *H01L 27/14627* (2013.01); *H01L 27/14636* (2013.01); *H01L 27/14643* (2013.01); *H01L 27/14685* (2013.01); *H04N 5/23212* (2013.01); *H04N 5/374* (2013.01)

(58) Field of Classification Search
CPC ......... H01L 27/14643; H01L 31/02024; H01L 31/02162
USPC ................. 257/291, 292, 293, 294
See application file for complete search history.

(56) References Cited

U.S. PATENT DOCUMENTS

| | | | | |
|---|---|---|---|---|
| 8,610,229 | B2 * | 12/2013 | Hsu | H01L 27/14623 257/432 |
| 2015/0311245 | A1 * | 10/2015 | Yamazaki | H01L 27/14632 257/43 |
| 2015/0325721 | A1 * | 11/2015 | Toda | H01L 27/14643 348/294 |

* cited by examiner

*Primary Examiner* — Tan N Tran
(74) *Attorney, Agent, or Firm* — JCIPRNET (57) ABSTRACT

An image sensor including a substrate, a trench isolation, a plurality of image sensing units, at least one phase detection unit, and an interconnection layer is provided. The trench isolation is in the substrate, and a plurality of active areas of the substrate are separated from each other by the trench isolation. The image sensing units and the at least one phase detection unit are in the active areas arranged in an array, and a sensing area of the at least one phase detection unit is smaller than a sensing area of each of the image sensing units. The interconnection layer is disposed on the image sensing units and the at least one phase detection unit. In addition, a method of fabricating an image sensor is also provided.

20 Claims, 7 Drawing Sheets

IMAGE SENSOR AND METHOD FOR MANUFACTURING THE SAME

BACKGROUND

Compared to charge coupled device (CCD) sensors, a CMOS image sensor has many advantages such as low voltage operation, low power consumption, compatibility with logic circuitry, random access, and low cost. Among the CMOS image sensors, a phase detection auto-focus (PDAF) CMOS image sensor is widely used. The PDAF CMOS image sensor adapted photodiode in conjunction with metal grids disposed thereon to render phase detection, thereby achieving a focus function.

The current isolation method for adjacent photodiodes is mostly implant isolation. However, implant isolation is not sufficient to eliminate the cross-talk effect between adjacent photodiodes, and the sensitivity of the PDAF CMOS image sensor is compromised.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
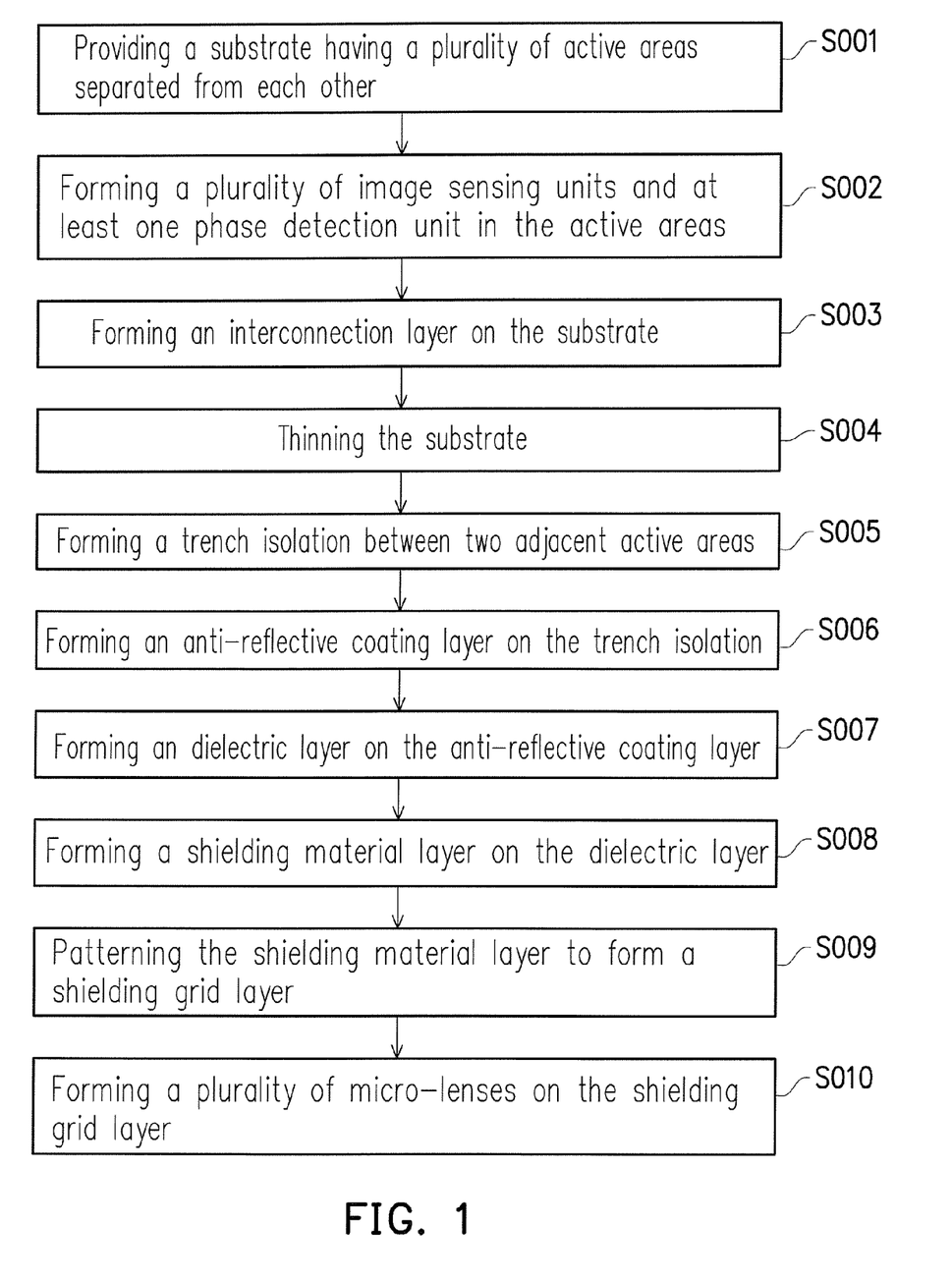
FIG. 1 is a flow chart illustrating a method of fabricating an image sensor in accordance with some embodiments.

FIG. 1 is a flow chart illustrating a method of fabricating an image sensor in accordance with some embodiments. FIGS. 2A-2J are cross-sectional views illustrating a manufacturing process of an image sensor in accordance with some embodiments.

Figure 2A:
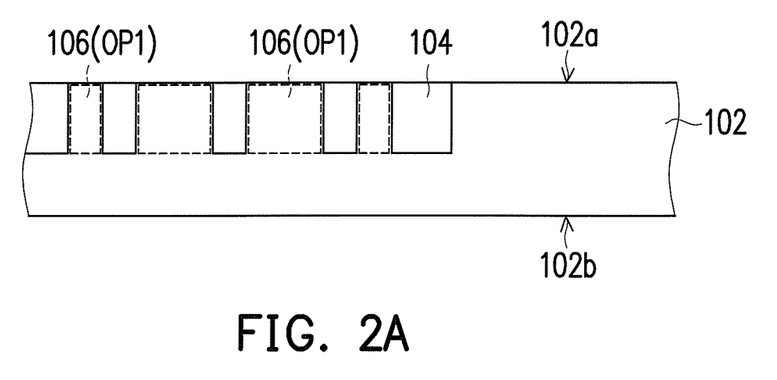
FIGS. 2A-2J are cross-sectional views illustrating a manufacturing process of an image sensor in accordance with some embodiments.

Referring to FIG. 1 and FIG. 2A, a substrate 102 having a plurality of active areas 106 separated from each other are provided in Step S001. Specifically, the substrate 102 has a first surface 102a and a second surface 102b opposite to the first surface 102a. A plurality of insulators 104 are formed in the substrate 102 and extend from the first surface 102a of the substrate 102 toward the interior of the substrate 102. In other words, the insulators 104 are formed to be embedded in the substrate 102. The insulators 104 have difference sizes, and thus between two adjacent insulators 104, an opening OP1 is formed. In other words, among the insulators 104, multiple openings OP1 having different sizes are formed to constitute the active areas 106 arranged in an array. Specifically, due to the difference in the size of the openings OP1 of the insulators 104, the active areas 106 would also have at least two different sizes. In some embodiment, the insulators 104 are shallow trench isolation (STI) structures. However, the present disclosure is not limited thereto. In some alternative embodiments, other insulating material may be adapted as the insulator to separate the active areas 106. The formation process of the insulators 104 (i.e. the STI structures) may be attained by the following steps. First, a plurality of shallow trenches having a predetermined depth are formed in the substrate 102 by photo-lithograph/etch process or other suitable patterning processes, for example. Next, a dielectric layer is deposited in the trenches. Subsequently, a portion of the dielectric layer is removed (e.g., polishing, etching, or a combination thereof) to form the insulators 104 (i.e. the STI structures). A material of the substrate 102 includes silicon, and a material of the insulators 104 (i.e. the STI structures) includes silicon oxide, silicon nitride, silicon oxynitride, other suitable materials, or a combination thereof. In some alternative embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In addition, in some embodiments, the substrate 102 has a thickness of about 1.5 to about 3 μm.

Figure 2B:
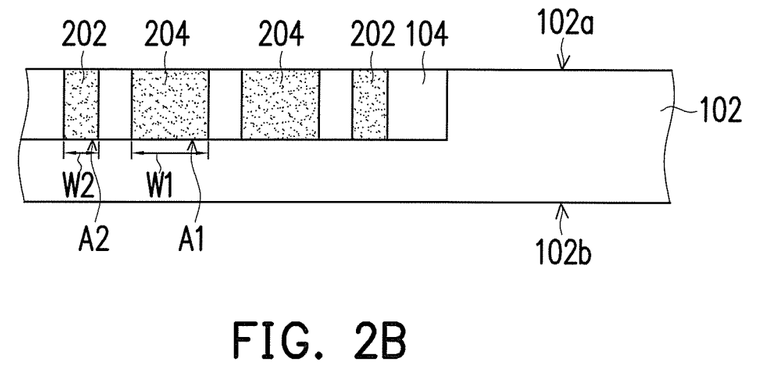

Referring to FIG. 1 and FIG. 2B, in Step S002, a plurality of image sensing units 204 and phase detection units 202 are formed in the active areas 106. In some embodiments, the image sensing units 204 and the phase detection units 202 are formed through ion implantation on the first surface 102a of the substrate 102. For example, the image sensing units 204 and the phase detection units 202 are photodiodes, wherein each of the photodiodes may include at least one p-type doped region, at least one n-type doped region, and a p-n junction formed between the p-type doped region and the n-type doped region. In detail, when the substrate 102 is a p-type substrate, n-type dopants, such as phosphorous or arsenic, may be doped into the active areas 106 to form n-type wells, and the resulting p-n junctions in the active areas 106 are able to perform the image sensing function and phase detection function. Similarly, when the substrate 102 is an n-type substrate, p-type dopants, such as boron of $BF_2$, may be doped into the active areas 106 to form p-type wells, and the resulting p-n junctions in the active areas 106 are able to perform the image sensing function and phase detection function. Detailed descriptions of ion implantation processes for forming n-type doped regions (wells) or p-type doped regions (wells) are omitted herein. In some alternatively embodiments, the image sensing units 204 and the phase detection units 202 may be other photoelectric elements capable of performing image sensing and phase detection function. When a reversed bias is applied to the p-n junctions of the image sensing units 204 and the phase detection units 202, the p-n junctions are sensitive to an incident light. The light received or detected by the image sensing units 204 and the phase detection units 202 is converted into photo-current such that analog signal representing intensity of the photo-current is generated.

As mentioned above, since the active areas 106 of the substrate 102 have different sizes, the photodiodes formed in the active areas 106 also have different sizes. For instance, a size of each of the image sensing units 204 is larger than a size of each of the phase detection unit 202. In particular, the image sensing units 204 have a width W1 and the phase detection units 202 have a width of W2, and as illustrated in FIG. 2B, width W1 is greater than width W2. In some embodiments, lengths of the image sensing units 204 and the phase detection units 202 are identical, and under the said circumstance, a sensing area A1 of each of the image sensing units 204 is greater than a sensing area A2 of each of the phase detection units 202. It should be noted that the lengths of the image sensing units 204 and the phase detection units 202 may be different in some alternative embodiments, as long as the sensing area A2 is smaller than the sensing area A1 of the image sensing units 204. Moreover, in some embodiments, the substrate 102 is exemplified to encompass multiple phase detection units 202, but it construes no limitation in the disclosure. In some alternative embodiments, one single phase detection unit 202 may be sufficient.

After formation of the image sensing units 204 and the phase detection units 202, a logic circuit may be formed on the substrate 102. The logic circuit is designate for receiving and processing signal originated from the image sensing units 204 and the phase detection units 202. The logic circuit, for example, includes conductive traces and NAND/NOR gates. A material of the logic circuit may include, but not limited to, metal and polysilicon. It should be noted that the location of the logic circuit is not limited on the substrate 102. In some alternative embodiments, the logic circuits may be fabricated on other elements formed subsequently, and the explanations will be discussed later.

Figure 2C:
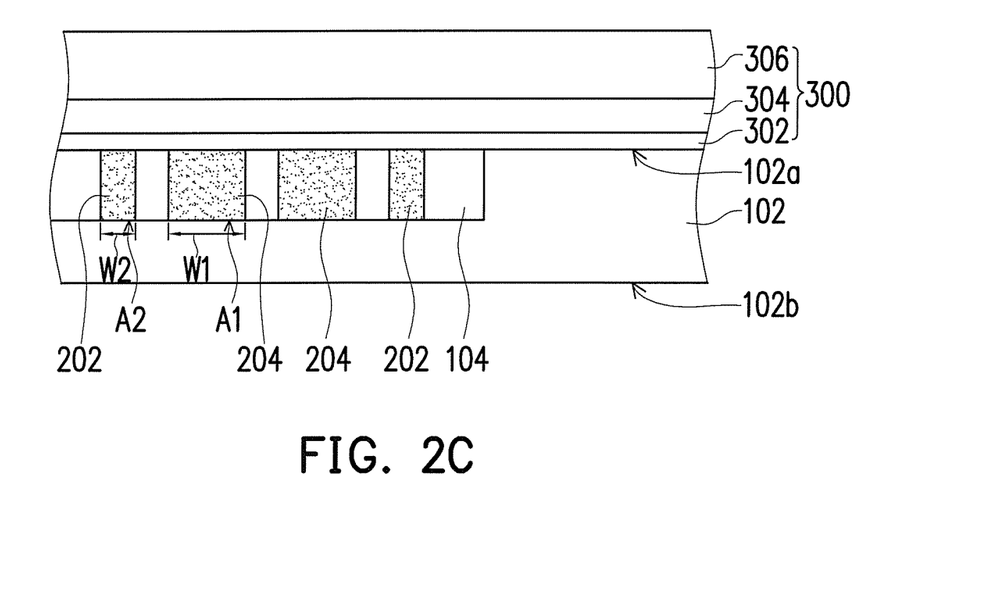

Referring to FIG. 1 and FIG. 2C, in step S003, an interconnection layer 300 is formed on the first surface 102a of the substrate 102. The interconnection layer 300 is in contact with the image sensing units 204 and the phase detection units 202 such that signal generated from the image sensing units 204 and the phase detection units 202 may be transmitted to other components for processing. For example, analog signal generated from the image sensing units 204 and the phase detection units 202 is transmitted by the interconnection layer 300 to other components, such as an analog-to-digital converter (ADC), for processing. In some embodiment, the interconnection layer 300 includes trace layers 302, 304, and a bonding substrate 306, but they construe no limitation in the disclosure. In some alternative embodiments, certain foregoing layers within the interconnection layer 300 may be omitted, as long as the signal of the image sensing units 204 and the phase detection units 202 are able to be transmitted to other components for processing.

In some embodiments, the trace layer 302 is in contact with and/or electrically connected to the image sensing units 204 and the phase detection units 202. Another trace layer 304 is formed on the trace layer 302, and is electrically connected to the trace layer 302. Suitable material for the trace layers 302, 304 includes conductors such as metal. It should be noted that the trace layer 302 and the trace layer 304 may be made of a same material or different materials, and may include a singe layer of metallic traces or multiple layers of metallic traces. In a scenario where multiple layers of metallic traces are found in the trace layers 302, 304, interlayer dielectric layers (ILD) are inserted between each metallic trace layer. A material of the ILD layer includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. The bonding substrate 306 is disposed over the trace layer 304. In some embodiments, the bonding substrate 306 may be a blank substrate for enhancing the mechanical strength of the device while serving as a protection layer. In some alternative embodiments, the bonding substrate 306 may includes metallic traces located thereon for signal transmission. For example, as mentioned above, instead of forming the logic circuit on the substrate 102, the logic circuit may be formed on the bonding substrate 306 in some embodiments.

Figure 2D:
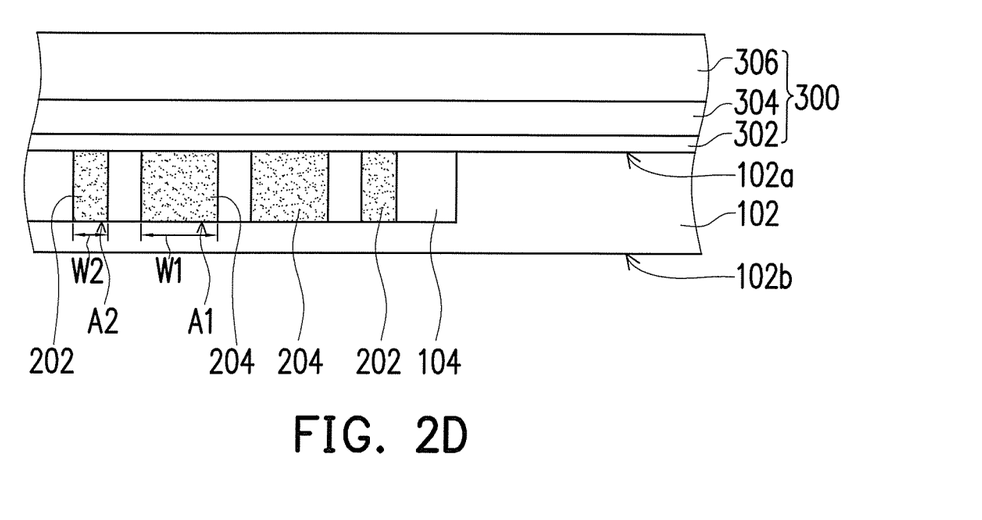

Subsequently, as illustrated in Step S004 of FIG. 1 and FIG. 2D, a step of thinning the substrate 102 is performed. In some embodiments, a back polishing process of the substrate 102 is performed to reduce the thickness of the substrate 102. In other words, the second surface 102b of the substrate 102 opposite to the interconnection layer 300 is polished. The method for back polishing includes mechanical polishing or chemical polishing. For example, in some embodiments, the back polishing is achieved by chemical mechanical polishing (CMP), and in some alternative embodiments, the back polishing is attained by chemical etching. The disclosure does not construe the polishing method, as long as the substrate 102 is polished to render a desired thickness.

Next, the substrate 102 is turned over such that the second surface 102b of the substrate 102 faces upwards. A trench isolation 400 including a plurality of first trench isolation patterns 402 and a plurality of second trench isolation patterns 404 is formed in the substrate 102 between active areas 106, as illustrated in Step S005 of FIG. 1 and FIG. 2E. In Step S005, the trench isolation 400 is formed corresponding to the insulators 104 (i.e. the STI structures shown in FIG. 2D) to separate each of the image sensing units 204 and each of the phase detection units 202. Unlike the insulators 104, the trench isolation 400 extends from the second surface 102b of the substrate 102 to the first surface 102a of the substrate 102. In other words, the trench isolation 400 penetrates through the substrate 102 and thus the trench isolation 400 is deep trench isolation (DTI) in some embodiments. Processes for forming trench isolation 400 (i.e. DTI) are similar to the formation processes of the insulators 104, and the formation processes of the trench isolation 400 (i.e. DTI) will be briefly described. Specifically, a plurality of deep trenches having a predetermined depth in the substrate 102 are first formed by photolithograph/etch process or other suitable patterning processes, for example. For example, the trenches may extend from the second surface 102b of the substrate 200 to the insulators 104. Next, a dielectric layer is deposited in the trenches. Subsequently, a portion of the dielectric layer is removed to form the trench isolation 400. In some embodiments, the dielectric layer is etched off to form the DTI. Similar to that of the insulators 104, a material of the trench isolation 400 includes silicon oxide, silicon nitride, silicon oxynitride, other suitable materials, or a combination thereof.

Figure 2E:
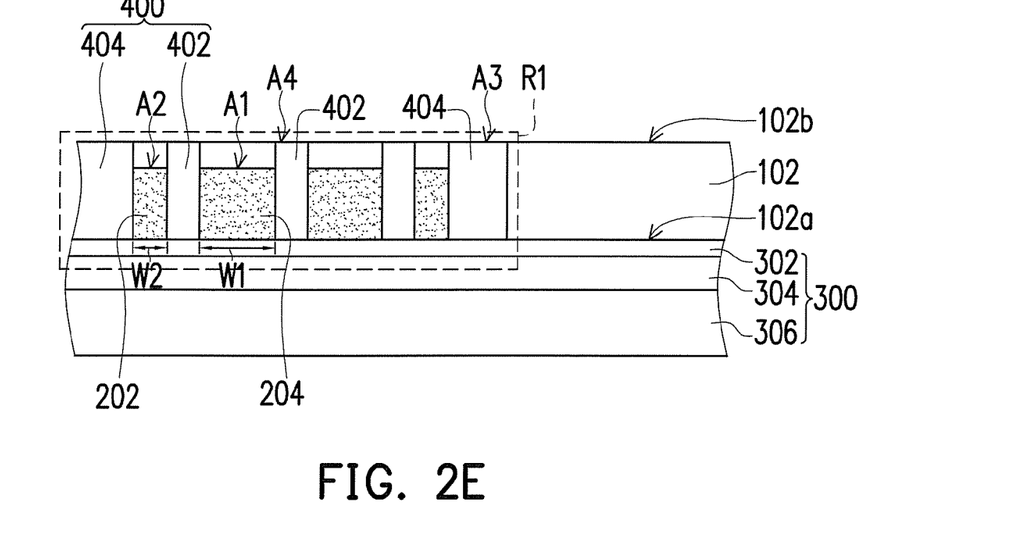
Figure 2F:
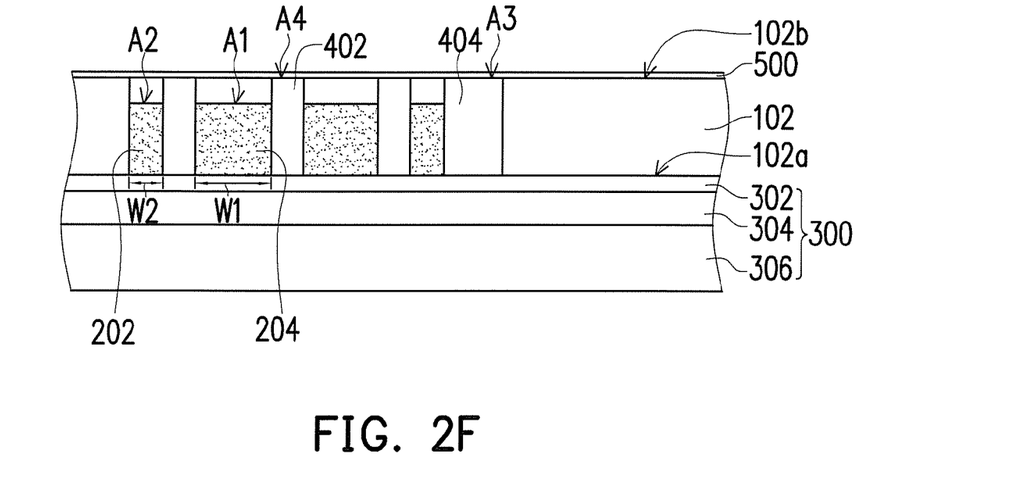
Figure 3:
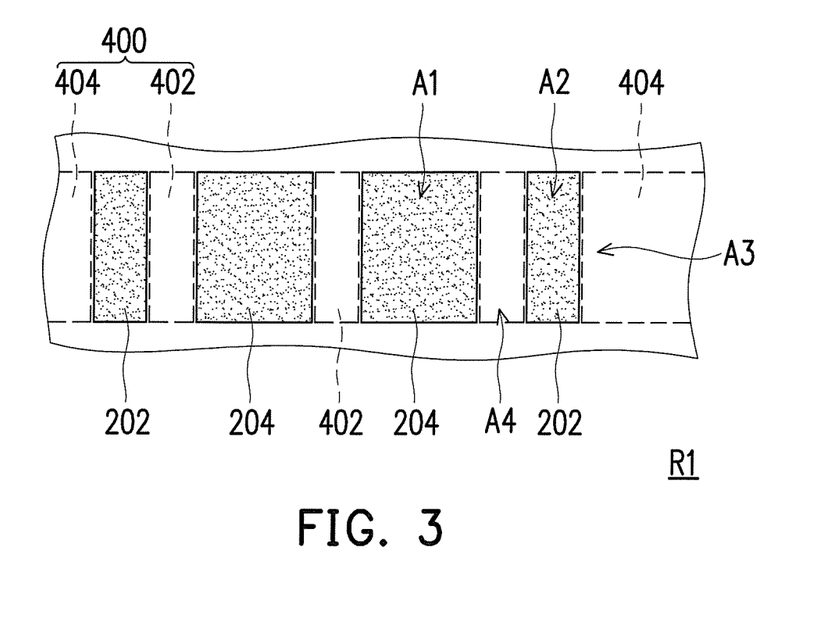
FIG. 3 is a perspective top view of a region of the image sensor of FIG. 2E.

FIG. 3 is a perspective top view of a region R1 of the image sensor of FIG. 2E. Referring to FIG. 2E and FIG. 3, as mentioned above, the trench isolation 400 includes first trench isolation patterns 402 and second trench isolation patterns 404. Each of the image sensing units 204 is surrounded by the first trench isolation patterns 402 and each of the phase detection units 202 is surrounds by both the first trench isolation patterns 402 and the second trench isolation patterns 404. Specifically, in some embodiments, each of the image sensing units 204 is adjacent to, or alternatively speaking, sandwiched by the first trench isolation patterns 402, and each of the phase detection units is adjacent to at least one of the second trench isolation patterns 404. In other words, each of the image sensing units 204 is not adjacent to any of the second trench isolation patterns 404. As mentioned above, the insulators 104 structure have different sizes, and therefore the first trench isolation patterns 402 and the second trench isolation patterns 404 disposed corresponding to the insulators 104 would also yield differences in size. Specifically, as illustrated in FIG. 2E and FIG. 3, an area A3 occupied by the second trench isolation patterns 404 is larger than an area A4 occupied by the first trench isolation patterns 402.

Referring back to FIG. 1 and FIG. 2F, in step S006, an anti-reflective coating (ARC) layer 500 may be employed on the second surface 102b of the substrate 102 to reduce the reflection of light. Specifically, a material of the ARC layer is, for example, silicon carbide (SiC), silicon nitride (SiN), or a high-k dielectric film. However, the disclosure is not limited thereto. Other conventionally suitable material may also be adapted as a material for the ARC layer.

Figure 2G:
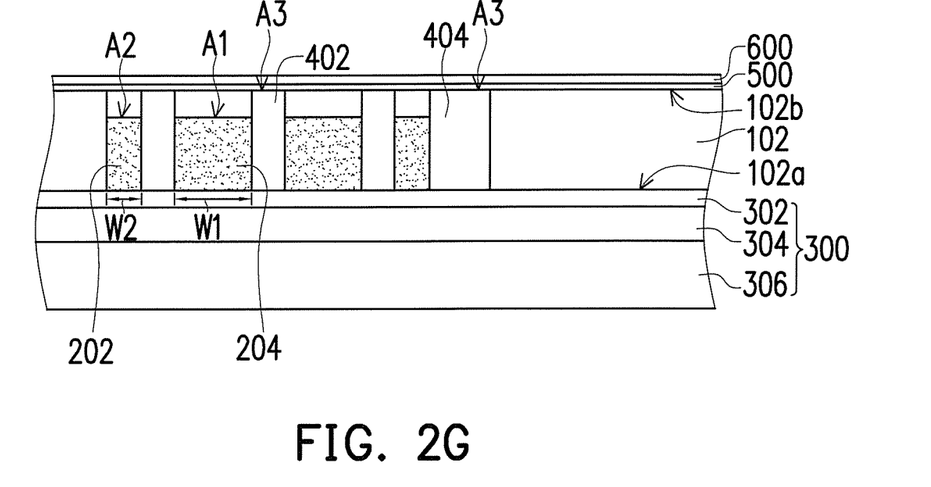

Subsequently, a dielectric layer 600 is formed over the ARC layer 500, as illustrated in Step S007 of FIG. 1 and FIG. 2G. The dielectric layer 600 serves the function of isolating conductive materials. In some embodiments, the dielectric layer 600 includes low-k dielectric materials. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 600 may include one or more dielectric materials and/or one or more dielectric layers. In some embodiments, the dielectric layer 600 is formed to a suitable thickness by Flowable CVD (FCVD), CVD, HDPCVD, SACVD, spin-on, sputtering, or other suitable methods.

Figure 2H:
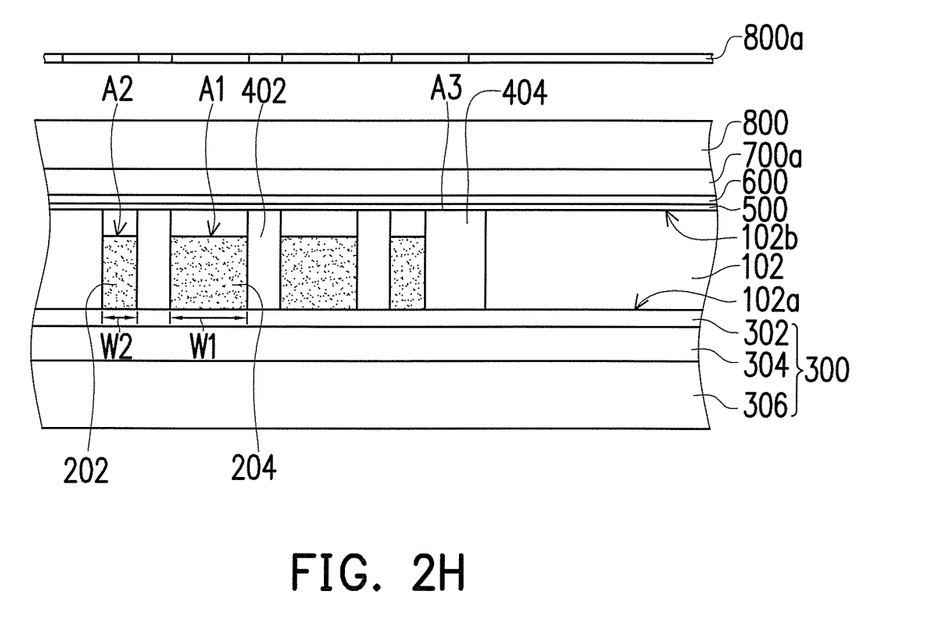

Next, referring to FIG. 1 and FIG. 2H, in Step S008, a shielding material layer 700a is formed over the dielectric layer 600 to shield components underneath thereof from an incident light. In some embodiment, the shielding material layer 700a includes metal such as tungsten, aluminum or other suitable reflective materials. Nevertheless, the material of the shielding material layer 700a is not limited thereto. Other opaque materials may be adapted as the material for the shielding material layer 700a, as long as the material encompasses low transmittance with respect to the incident light.

Figure 2I:
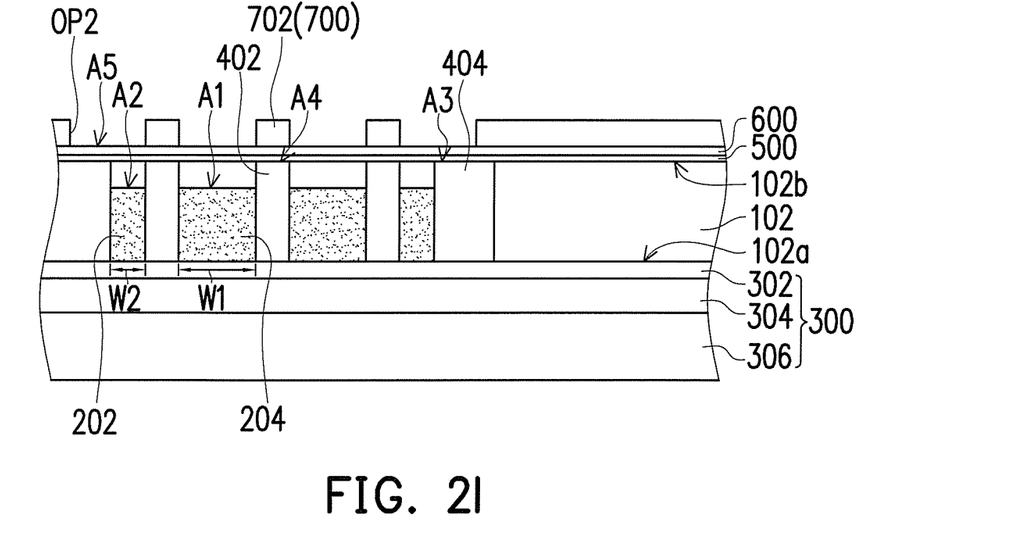

Referring to FIG. 2H and FIG. 2I, the shielding material layer 700a is patterned to form a shielding grid layer 700, as illustrated in Step S009 of FIG. 1. In some embodiments, a mask material layer 800 is formed over the shielding material layer 700a using processes such as spin-coating. The mask material layer 800 is sensitive to a specific exposure beam such as KrF, ArF, EUV or e-beam light. For example, the mask material layer may be a photoresist made of a photosensitive resin or other suitable materials. In some embodiments, the mask material layer includes polymers, quencher, chromophore, solvent and/or chemical amplifier (CA). Owing to the help of the photomask 800a, a photolithography process is performed on the mask material layer 800, and an etching process may be subsequently performed to pattern the shielding material layer 700a. Specifically, the photolithography process includes exposure, bake, and development, and the etching process may include wet etching or dry etching.

Referring to FIG. 2I again, the shielding grid layer 700 is formed over the dielectric layer 600. The shielding grid layer 700 includes a plurality of shielding grid patterns 702. In order for the incident light to reach the sensing area A1 of the image sensing units 204 and the sensing area A2 of the phase detection units 202, the shielding grid patterns 702 are not overlapped with the image sensing units 204 and the phase detection units 202. As illustrated in FIG. 2I, the shielding grid patterns 702 completely shield the trench isolation 400 surrounding the image sensing units 204 while partially shield the trench isolation 400 surrounding the phase detection units 202. Alternatively speaking, as mentioned above, each of the image sensing units 204 is adjacent to the first trench isolation patterns 402, and each of the phase detection units is adjacent to at least one of the second trench isolation patterns 404. Therefore, the shielding grid patterns 702 completely shield the first trench isolation patterns 402 while partially shield the second trench isolation patterns 404. Moreover, between two adjacent shielding grid patterns 702, an opening OP2 is formed. Since the adjacent shielding grid patterns 702 are separated by substantially a same distance, among the shielding grid patterns 702, multiple opening OP2 having a substantially identical area A5 are formed. The area A5 of the openings OP2 of the shielding grid patterns 702 is substantially equal to the sensing area A1 of the image sensing units 204. On the other hand, the area A5 of the openings OP2 of the shielding grid patterns 702 is notably larger than the sensing area A2 of the phase detection units 202. Due to the fact that the area A5 of the openings OP2 of the shielding grid patterns 702 is larger than the sensing area A2 of the phase detection units 202, at least part of the second trench isolation patterns 404 are overlapped with the openings OP2 of the shielding grid patterns 702. For instances, in some embodiments, an overlapping percentage of the area A3 occupied by each of the second trench isolation patterns 404 and the area A5 of the openings OP2 of the shielding grid patterns 702 may be greater than 50% of the total area A5 of the openings OP2 of the shielding grid patterns 702.

Figure 2J:
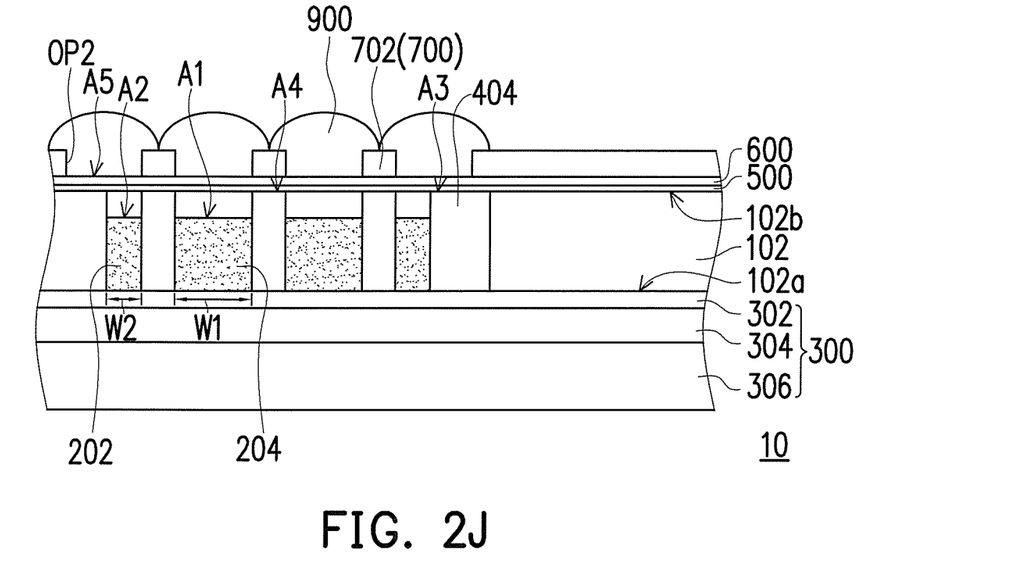

Thereafter, referring to FIG. 1 and FIG. 2J, in Step S100, a plurality of micro-lenses 900 for focusing the incident light beams are formed on the shielding grid layer 700 to complete the fabrication process of an image sensor 10. Each of the micro-lenses 900 includes a convex shaped upper surface which facilitates the convergence of the incident light, thereby enhancing the light received by the sensing area A1 of the image sensing units 204 and the sensing area A2 of the phase detection units 202. The micro-lenses 900 may be fabricated by materials such as silicon dioxide or a resin material on intermediate transparent film.

In some embodiments, since the image sensing units 204 and the phase detection units 202 are CMOS (Complementary-Metal-Oxide-Semiconductor) photodiodes, the image sensor 10 may be considered as a phase detection auto-focus (PDAF) CMOS image sensor. Nevertheless, the disclosure is not limited thereto. In alternative embodiments, the image sensor 10 may be a sensor of other forms. Moreover, since the sensing area A2 of the phase detection units 202 does overlap with the entire area A5 of the openings OP2 of the shielding grid patterns 702, the phase detection units 202 are able to detect and calculate the direction of the incident light, thereby achieving a high sensitivity in focus function. Therefore, a CMOS image sensor with high pixel resolution may be attained. Moreover, due to the utilization of the trench isolation 400 between the image sensing units 204 and the phase detection units 202, the cross-talk effect between adjacent image sensing units 204 and phase detection units 202 is effectively reduced, thereby enhancing the sensitivity of the image sensor 10 as a whole.

In accordance with some embodiments of the present disclosure, an image sensor includes a substrate, a trench isolation, a plurality of image sensing units, at least one phase detection unit, and an interconnection layer. The trench isolation is in the substrate, and a plurality of active areas of the substrate are separated from each other by the trench isolation. The image sensing units and the at least one phase detection unit are in the active areas arranged in an array, and a sensing area of the at least one phase detection unit is smaller than a sensing area of each of the image sensing units. The interconnection layer is disposed on the image sensing units and the at least one phase detection unit.

In accordance with alternative embodiments of the present disclosure, an image sensor includes a substrate, a trench isolation, a plurality of image sensing units, at least one phase detection unit, a shielding grid layer, and an interconnection layer. The trench isolation is in the substrate, and a plurality of active areas of the substrate are separated from each other by the trench isolation. The image sensing units and the at least one phase detection unit are in the active areas arranged in an array. The shielding grid layer includes a plurality shielding grid patterns, the shielding grid patterns are disposed on the trench isolation such that the shielding grid patterns completely shield the trench isolation surrounding the image sensing units and partially shield the trench isolation surrounding the at least one phase detection unit. The interconnection layer is disposed on the image sensing units and the at least one phase detection unit.

In accordance with yet alternative embodiments of the present disclosure, a method for fabricating an image sensor includes at least the following steps. A substrate having a plurality of active areas separated from each other is provided. A plurality of image sensing units and at least one phase detection unit are formed in the active areas, and a size of each of the image sensing units is larger than a size of the at least one phase detection unit. An interconnection layer is formed on the substrate. A trench isolation is formed between two adjacent active areas. A shielding material layer is patterned to form a shielding grid layer over the substrate opposite to the interconnection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a substrate;
a trench isolation in the substrate, wherein a plurality of active areas of the substrate are separated from each other by the trench isolation;
a plurality of image sensing units;
at least one phase detection unit, wherein the image sensing units and the at least one phase detection unit are in the active areas arranged in an array, and a sensing area of the at least one phase detection unit is smaller than a sensing area of each of the image sensing units;
an interconnection layer, disposed below the image sensing units and the at least one phase detection unit; and
a shielding grid layer over the trench isolation, wherein the shielding grid layer comprises a plurality of openings having substantially a same area, the sensing area of each of the image sensing units is equal to the area of the openings, and the sensing area of the at least one phase detection unit is smaller than the area of the openings.

2. The image sensor according to claim 1, wherein the trench isolation comprises a plurality of first trench isolation patterns adjacent to each of the image sensing units and at least one second trench isolation pattern adjacent to the at least one phase detection unit, and an area occupied by the second trench isolation pattern is larger than an area occupied by the first trench isolation pattern.

3. The image sensor according to claim 1, further comprising a dielectric layer, disposed between the shielding grid layer and the trench isolation.

4. The image sensor according to claim 1, wherein a material of the shielding grid layer comprises tungsten or aluminum.

5. The image sensor according to claim 1, wherein the substrate has a thickness of about 1.5 µm to about 3 µm.

6. The image sensor according to claim 1, further comprising a plurality of micro-lenses disposed over the shielding grid layer.

7. The image sensor according to claim 1, wherein the image sensing units and the at least one phase detection unit are photodiodes.

8. An image sensor, comprising:
a substrate;
a trench isolation in the substrate, wherein a plurality of active areas of the substrate are separated from each other by the trench isolation;
a plurality of image sensing units;
at least one phase detection unit, wherein the image sensing units and the at least one phase detection unit are in the active areas arranged in an array;
a shielding grid layer, comprising a plurality shielding grid patterns, a plurality of first openings above the image sensing units, and a second opening above the at least one phase detection unit, wherein each of the first openings is separated from the second opening by the shielding grid patterns, a sensing area of each of the image sensing units is equal to an area of each of the first openings, and a sensing area of the at least one phase detection unit is smaller than an area of the second opening; and
an interconnection layer, disposed below the image sensing units and the at least one phase detection unit.

9. The image sensor according to claim 8, wherein the shielding grid patterns are not overlapped with the image sensing units and the at least one phase detection unit.

10. The image sensor according to claim 8, wherein the trench isolation comprises a plurality of first trench isolation patterns adjacent to each of the image sensing units and at least one second trench isolation pattern adjacent to the at least one phase detection unit, and the shielding grid patterns completely shield the first trench isolation patterns and partially shield the at least one second trench isolation pattern.

11. The image sensor according to claim 8, further comprising a dielectric layer, disposed between the shielding grid layer and the trench isolation.

12. The image sensor according to claim 8, wherein a material of the shielding grid layer comprises tungsten or aluminum.

13. The image sensor according to claim 8, wherein the substrate has a thickness of about 1.5 µm to about 3 µm.

14. The image sensor according to claim 8, further comprising a plurality of micro-lenses disposed over the shielding grid layer.

15. The image sensor according to claim 8, wherein the image sensing units and the at least one phase detection unit are photodiodes.

16. The image sensor according to claim 8, wherein the substrate is a silicon substrate, and a portion of the silicon substrate is located between the first openings and the image sensing units.

17. A method of fabricating an image sensor, comprising:
providing a substrate having a plurality of active areas separated from each other, the substrate comprising a first surface and a second surface opposite to the first surface;
forming a first trench isolation in the substrate, wherein the first trench isolation has a plurality of openings accommodating the active areas and a depth of the first trench isolation is smaller than a thickness of the substrate;
forming a plurality of image sensing units and at least one phase detection unit in the openings, wherein a size of each of the image sensing units is larger than a size of the at least one phase detection unit;
forming an interconnection layer on the first surface of the substrate;
after forming the first trench isolation, forming a plurality of trenches extending from the second surface of the substrate to the first trench isolation and filling a dielectric material in the trenches to form a second trench isolation, wherein the second trench isolation penetrates the substrate; and
forming a shielding grid layer over the substrate opposite to the interconnection layer.

18. The method of fabricating an image sensor according to claim 17, further comprising:
forming the image sensing units and the at least one phase detection unit in the active areas.

19. The method of fabricating an image sensor according to claim 17, further comprising:
forming a dielectric layer between the substrate and the shielding grid layer; and
forming a plurality of micro-lenses over the shielding grid layer.

20. The method of fabricating an image sensor according to claim 17, wherein the interconnection layer comprises at least one trace layer, and/or a bonding substrate.

* * * * *